United States Patent
Toulouse et al.

(10) Patent No.: US 10,837,684 B2
(45) Date of Patent: Nov. 17, 2020

(54) AUTOMATIC CONTROLS METHOD FOR ADDING THE OPTIMAL AMOUNT OF REFRIGERANT TO A DIRECT EXPANSION COOLING SYSTEM

(71) Applicant: DELL PRODUCTS, L.P., Round Rock, TX (US)

(72) Inventors: Michael M. Toulouse, San Jose, CA (US); Tyler B. Duncan, Austin, TX (US); Trey S. Wiederhold, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 123 days.

(21) Appl. No.: 15/960,450

(22) Filed: Apr. 23, 2018

(65) Prior Publication Data
US 2019/0323749 A1   Oct. 24, 2019

(51) Int. Cl.
*F25B 45/00*   (2006.01)
*H05K 7/20*   (2006.01)

(52) U.S. Cl.
CPC ......... *F25B 45/00* (2013.01); *H05K 7/20745* (2013.01); *H05K 7/20827* (2013.01);
(Continued)

(58) Field of Classification Search
CPC .......... H05K 7/20836; H05K 7/20745; H05K 7/20827; F25B 2400/01; F25B 2700/171; F25B 2700/1931; F25B 2600/25; F25B 2700/15; F25B 2700/2103; F25B 2700/19; F25B 45/00
See application file for complete search history.

(56) References Cited

U.S. PATENT DOCUMENTS

| 4,768,347 A | * | 9/1988 | Manz | ............ | F25B 45/00 62/149 |
| 5,209,077 A | * | 5/1993 | Manz | ............ | F25B 45/00 62/149 |

(Continued)

OTHER PUBLICATIONS

Kleyman, Bill, Using Load Bank Solutions to Optimize Data Center Commissioning, Data Center Knowledge, http://www.datacenterknowledge.com/archives/2012/11/12/using-load-bank-solutions-tooptimize-data-center-commissioning Nov. 12, 2012.

*Primary Examiner* — Marc E Norman
*Assistant Examiner* — Heather J Huddle
(74) *Attorney, Agent, or Firm* — Isidore PLLC

(57) ABSTRACT

An automated refrigerant recharging system determines whether a cooling load parameter of a direct expansion (DX) cooling system that cools information technology (IT) modules of an information handling system (IHS) has reached a defined recharging threshold that results in a response of the pressure value for measurement by the pressure transducer. In response to the cooling load parameter being equal to or greater than the defined recharging threshold, a controller determines whether a pressure value of the refrigerant of the DX cooling system is less than a defined target pressure value corresponding to the defined recharging threshold. In response to determining that the pressure value of the refrigerant of the DX cooling system is less than the defined target pressure value, the controller autonomously opens a control valve to transfer refrigerant to the DX cooling system.

16 Claims, 7 Drawing Sheets

(52) U.S. Cl.
CPC ...... *H05K 7/20836* (2013.01); *F25B 2400/01* (2013.01); *F25B 2600/25* (2013.01); *F25B 2700/15* (2013.01); *F25B 2700/171* (2013.01); *F25B 2700/19* (2013.01); *F25B 2700/1931* (2013.01); *F25B 2700/2103* (2013.01)

(56) References Cited

U.S. PATENT DOCUMENTS

| | | |
|---|---|---|
| 7,472,557 B2 | 1/2009 | Kang et al. |
| 8,037,698 B2 | 10/2011 | Heckt et al. |
| 8,462,496 B2 | 6/2013 | Schmitt et al. |
| 9,285,138 B1 | 3/2016 | Sasser |
| 2007/0167125 A1* | 7/2007 | Rasmussen .......... H05K 7/2079 454/184 |
| 2010/0057263 A1* | 3/2010 | Tutunoglu ............ F25B 49/027 700/282 |

\* cited by examiner

AUTOMATIC CONTROLS METHOD FOR ADDING THE OPTIMAL AMOUNT OF REFRIGERANT TO A DIRECT EXPANSION COOLING SYSTEM

BACKGROUND

1. Technical Field

The present disclosure relates in general to cooling systems for an information handling system (IHS), and more particularly to recharging refrigerant of a direct expansion (DX) cooling system of IHSs.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

As the capabilities of IHSs have improved, the power requirements of IHSs and their component information handling resources have increased. Accordingly, the amount of heat produced by such information handling resources has increased. Because the electrical properties of information handling resources may be adversely affected by the presence of heat (e.g., heat may damage sensitive information handling resources and/or some information handling resources may not operate correctly outside of a particular range of temperatures), IHSs often include cooling systems configured to cool such information handling resources. The construction and configuration of cooling systems may be of particular difficulty in data centers.

A data center will typically include multiple IHSs (e.g., servers), which may be arranged in racks. Modular data centers further arrange these racks in modular building blocks. Each IHS and its component information handling resources may generate heat, which can adversely affect the various IHSs and their component information handling resources if the generated heat is not efficiently removed or reduced. To cool information handling systems in data centers, information handling systems are often cooled via the impingement of air driven by one or more air movers. To effectively control the temperature of information handling resources, especially in installations in which a modular data center (MDC) is outdoor-exposed (e.g., those placed on building roofs or elsewhere), the modular data center must provide support for extreme temperatures, weather, and airflow ranges. Mechanical cooling using direct expansion (DX) cooling systems enables cooling in high temperature or high humidity.

BRIEF SUMMARY

The present disclosure provides a direct expansion cooling system having automated refrigerant recharging, an information handling system (IHS), and a method for autonomously recharging a refrigerant of a direct expansion (DX) cooling system.

In accordance with the teachings of the present disclosure, an automated refrigerant recharging system includes a direct expansion (DX) cooling system and a reservoir containing a refrigerant. The DX cooling system absorbs and transfers thermal energy generated by one or more information technology (IT) modules of an information handling system (IHS). A control valve of the DX cooling system selectively transfers refrigerant from the reservoir to the DX cooling system. A performance transducer detects a cooling load parameter of the DX cooling system. A pressure transducer detects a pressure value of the refrigerant of the DX cooling system. A controller is in communication with a supplemental heater, the control valve, and the performance and pressure transducers. The controller executes an automated refrigerant recharging utility to enable the automated refrigerant recharging system to determine whether the cooling load parameter of the DX cooling system has reached a defined recharging threshold. With the cooling load parameter having reached the defined recharging threshold, a meaningful response of the pressure value is provided for measurement by the pressure transducer. The meaningful response is related to whether an amount of refrigerant is sufficient for the current cooling load. In response to the cooling load parameter being equal to or greater than the defined recharging threshold, the controller determines whether the pressure value of the refrigerant of the DX cooling system is less than a defined target pressure value corresponding to the defined recharging threshold. In response to determining that the pressure value of the refrigerant of the DX cooling system is less than the defined target pressure value, the controller autonomously opens the control valve to transfer refrigerant to the DX cooling system.

According to aspects of the present innovation, a data center of an IHS includes one or more IT modules and a DX cooling system that absorbs and transfers thermal energy generated by the one or more IT modules. An automated refrigerant recharging system includes a reservoir, a control valve, performance and pressure transducers, and a controller. The reservoir contains a refrigerant. The performance transducer detects a cooling load parameter of the DX cooling system. The pressure transducer detects a pressure value of the refrigerant of the DX cooling system. The controller is in communication with a supplemental heater, the control valve, and the performance and pressure transducers. The controller selectively opens the control valve to transfer refrigerant from the reservoir to the DX cooling system in response to specific conditions detected within the DX cooling system. The controller executes an automated refrigerant recharging utility to enable the automated refrigerant recharging system to perform certain functions. The controller determines whether the cooling load parameter of the DX cooling system has reached a defined recharging threshold. The defined recharging threshold provides a sufficient cooling load so that the cooling system responds with a meaningful pressure value for measurement by the pressure transducer that is related to whether an adequate amount of refrigerant is available. In response to the cooling load parameter being equal to or greater than the defined recharging threshold, the controller determines whether the pressure value of the refrigerant of the DX cooling system is less than a defined target pressure value corresponding to the defined recharging threshold. In response to determining that the pressure value of the refrigerant of the DX cooling system is less than the defined target pressure value, the controller autonomously opens the control valve to transfer refrigerant to the DX cooling system.

According to illustrative embodiments of the present disclosure, a method is provided for automatically refilling refrigerant in a DX cooling system of an IHS, the DX cooling system having at least one conduit within which a volume of cooling fluid (e.g., a refrigerant) flows to support cooling of the IHS. The method includes determining whether a cooling load parameter of the DX cooling system has reached a defined recharging threshold. In response to the cooling load parameter being equal to or greater than the defined recharging threshold, the method includes determining whether a pressure value of the refrigerant of the DX cooling system is less than a defined target pressure value corresponding to the defined recharging threshold. In response to determining that the pressure value of the refrigerant of the DX cooling system is less than the defined target pressure value, the method includes the controller autonomously opening a control valve to transfer additional refrigerant to the DX cooling system.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
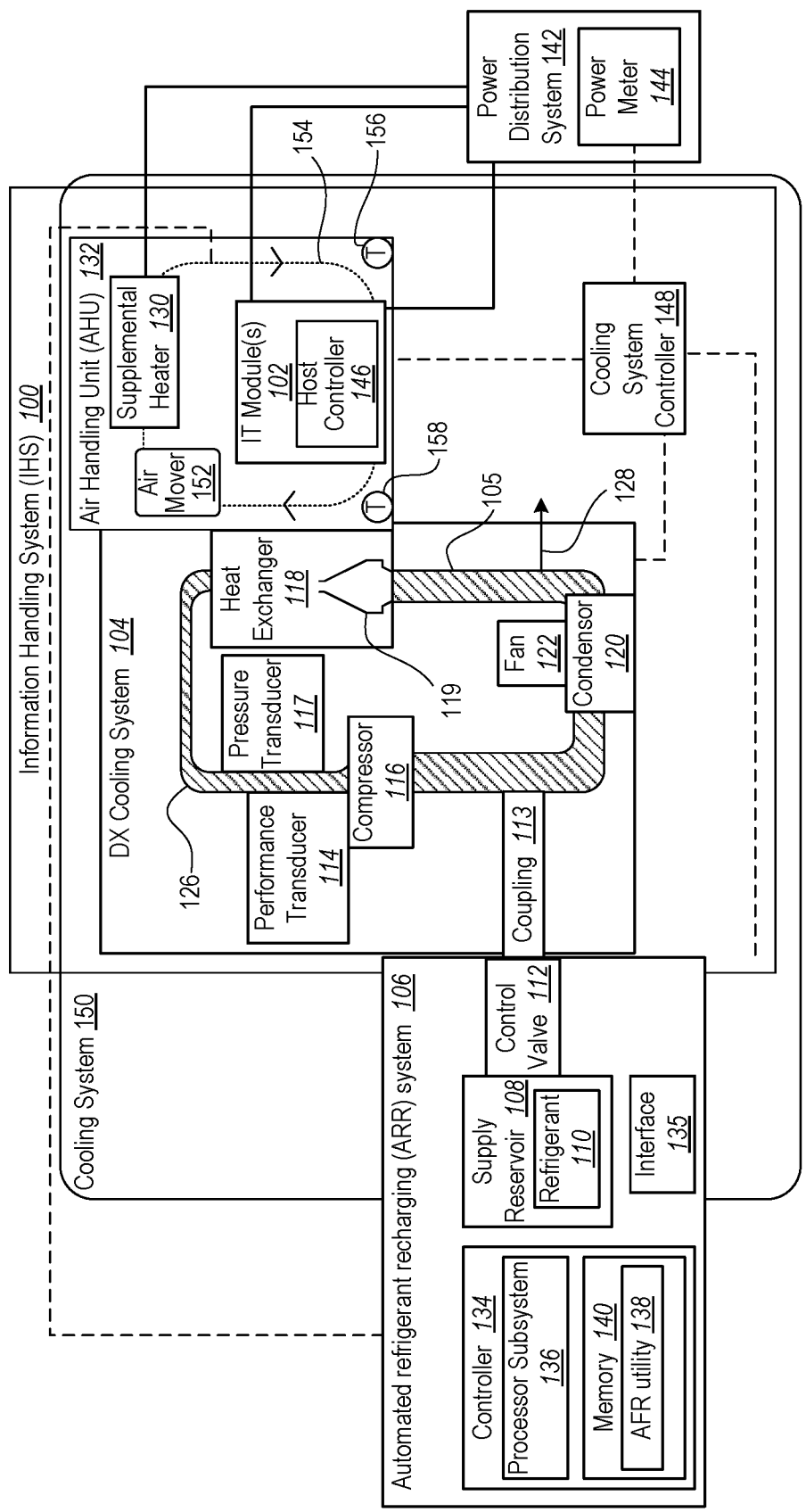
FIG. 1 is a block diagram illustrating an example information handling system (IHS) having automatic refrigerant recharging, according to one or more embodiments.

According to one or more aspects of the present disclosure, an automated refrigerant recharging system determines whether a cooling load parameter of a direct expansion (DX) cooling system that cools information technology (IT) modules of an information handling system (IHS) has reached a defined recharging threshold. In response to the cooling load parameter being equal to or greater than the defined recharging threshold, a controller determines whether a pressure value of the refrigerant of the DX cooling system is less than a defined target pressure value corresponding to the defined recharging threshold. In response to determining that the pressure value of the refrigerant of the DX cooling system is less than the defined target pressure value, the controller autonomously opens a control valve to transfer refrigerant to the DX cooling system.

DX cooling systems can be used to mechanically reduce the temperature of outside or recirculated cooling air used to cool IHSs of a data center, and in particular a modular data center (MDC). An automated DX refrigerant recharging approach avoids or mitigates specific aspects of cooling an MDC. In order to achieve optimal refrigerant charge for a DX cooling system, the MDC is made to operate at peak load, which is primarily due to compute activities by the MDC. When not operating at peak conditions, an air handling technician is unable to manipulate the level of compute activities to reach peak conditions. Any manual changes to devices of the DX cooling system by the air handling technician will register as faults in the system, causing an interruption in operation of the IHSs, which can be problematic for IHSs required to have high availability. An existing solution is to charge a refrigerant loop of the DX cooling system to an approximate level given the achievable cooling load. Additional service calls are required to add refrigerant as the load increases toward a maximum. The existing solution limits an operational capacity of the IHSs and incurs additional maintenance expenses.

According to one aspect of the disclosure, the controller monitors telemetry for an operating temperature and pressure of the working refrigerant, and identifies the compute load of the IHS. The controller supplements the compute load with additional synthetic compute load. Specifically, supplemental heat is directed to an evaporator the DX cooling system to create optimized refrigerant charge conditions. The controller then administers the charging process, including manipulating all devices of the DX cooling system to the required positions for charging. The controller determines that the DX cooling system is completely recharged and terminates the recharging.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 is a block diagram illustrating IHS 100 having IT module(s) 102 that generate heat as a byproduct of providing certain functionalities such as computing workload, network communication, and data storage. Within the general context of IHSs, IHS 100 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communication between the various hardware components.

IHS 100 includes DX cooling system 104, which absorbs and transfers away thermal energy generated by IT module(s) 102. DX cooling system 104 includes a liquid cooling loop 105 having a one or more interconnected conduits through which a volume of cooling liquid (e.g. refrigerant 110) flows to absorb heat generated by heat-generating components within IHS 100. DX cooling system 104 includes or is coupled to automated refrigerant recharging (ARR) system 106, which includes reservoir 108 containing refrigerant 110. Automated refrigerant recharging system 106 automatically charges or recharges refrigerant levels in DX cooling system 104. ARR system 106 includes control valve 112, which can be selectively opened to transfer refrigerant 110 from the supply reservoir 108 to DX cooling system 104. In one or more embodiments, ARR system 106 or at least supply reservoir 108 is replaceable by disconnecting a coupling 113. Performance transducer 114 detects a cooling load parameter of DX cooling system 104. In one embodiment, compressor 116 compresses refrigerant 110 at a particular compressor speed that represents the cooling load parameter. Pressure transducer 117 detects a pressure value of the refrigerant 110 of DX cooling system 104, such as a high-side pressure created by compressor 116.

DX cooling system 104 provides a heat absorption and transfer cycle utilizing heat exchanger 118 and condenser 120. In heat exchanger 118, a volume of refrigerant 110 is allowed to expand in an evaporator 119 from a liquid state to at least partially a gas state at a low side pressure, absorbing heat from IT module(s) 102. At condenser 120, the refrigerant 110 returns to a liquid state as heat is removed by a fan 122.

The correct amount of refrigerant 110 required within DX cooling system 104 can vary based on one or more factors. In one or more embodiments, the configuration of the IHS 100 can have differing lengths of a refrigerant loop or conduits 105, thus changing the required volume of refrigerant within DX cooling system 104. Leaks 128 of refrigerant over time can reduce the volume of refrigerant 110. Charging or recharging the DX cooling system 104 with the proper amount of additional refrigerant 110 is preferably completed when the DX cooling system 104 is operating at its maximum or design target cooling load. A maximum or design target cooling load is reached when DX cooling system 104 absorbs and transfers a maximum amount of heat as thermal energy in refrigerant 110. This amount of heat is related to how much electrical power within IHS 100 is being converted into waste heat. A significant amount of the electrical power consumed within IHS 100 is by IT modules 102. When the amount/level of refrigerant 110 is adequate for the target cooling load, sufficient liquid refrigerant 110 is present to supply compressor 116 without interruption. A high side 126 of the refrigerant loop 105 can reach a target pressure value when the amount/level of refrigerant 110 is inadequate for the target cooling load. When an insufficient amount of liquid refrigerant 110 is present to supply compressor 116 at the target cooling load, interruptions occur in the supply of liquid refrigerant 110 to the compressor 116. With the compressor 116 interrupted in compressing the refrigerant 110, a corresponding pressure output of the compressor 116 is limited, which indicates a need for more refrigerant 110 to be added. In one or more embodiments, the maximum cooling load is largely or entirely attributable to the thermal energy generated by the IT module(s) 102.

In one embodiment, automated refrigerant recharging system 106 dynamically monitors DX cooling system 104 to provide additional amounts of refrigerant 110 (i.e., charge the system) as required while IT modules 102, and thus DX cooling system 104, are operating at higher levels of cooling. For example, automated refrigerant recharging system 106 can provide more refrigerant 110 as required to provide appropriate amounts of cooling in response to conditions such as a higher seasonal ambient temperature, an increase in assigned workload to IHS 100, an increased cooling load created by upgrading IHS 100 with additional IT module(s) 102, etc. The cooling loop 105 has a design capacity of refrigerant 110 and the operating conditions can indicate whether or not the cooling loop 105 is at the design limit.

Waiting until IT module(s) 102 are processing a sufficient workload to generate this level of thermal energy can be inconvenient. In one or more embodiments, automated refrigerant recharging system 106 is a portable unit that can be connected to IHS 100 on discrete occasions such as commissioning, periodic maintenance, or in response to a component failure and replacement. One such automated refrigerant recharging system 106 can be economically used to support a number of DX cooling systems 104. On occasions of use of automated refrigerant recharging system 106, a supplemental heater 130 is either integrally installed into, or selectively engaged to, an air handling unit (AHU) 132 of the DX cooling system 104. Supplemental heater 130 can provide a sufficient synthetic cooling load so that a proper amount of refrigerant 110 can be added by automated refrigerant recharging system 106. Thereby, DX cooling system 104 has sufficient cooling capacity when IT module(s) 102 are generating a peak or maximum cooling load, avoiding any need to throttle the workload performed by IHS 100.

A controller 134 of automated refrigerant recharging system 106 is in communication with the control valve 112, the performance and pressure transducers 114, 117, and supplemental heater 130 via a wired or wireless interface 135. Controller 134 includes a processor subsystem 136 that executes an automated refrigerant recharging utility 138 contained in a memory 140 to enable the automated refrigerant recharging system 106 to provide functionality according to aspects of the present disclosure. In one or more embodiments, controller 134 determines whether the cooling load parameter of the DX cooling system 104 has reached a defined recharging threshold. The defined recharging threshold reflects that a sufficient cooling load is present. The sufficient cooling load drives the pressure value to the extent that sufficient refrigerant is available for measurement by the pressure transducer 117. In response to the cooling load parameter being equal to or greater than the defined recharging threshold, processor subsystem 136 of controller 134 determines whether the pressure value of the refrigerant 110 of the DX cooling system 104 is less than an amount sufficient to reach a defined target pressure value corresponding to the defined recharging threshold. In response to determining that the pressure value of the refrigerant 110 of the DX cooling system 104 is less than the defined target pressure value, controller 134 autonomously opens the control valve 112 to transfer refrigerant 110 to the DX cooling system. In response to determining that the pressure value of the refrigerant 110 of the DX cooling system 104 is equal to or greater than the defined target pressure value, controller 134 closes control valve 112 to stop transfer of refrigerant 110 to DX cooling system 104. If already closed, control valve 112 is maintained in a closed state. Controller 134 triggers a notification to IHS 100 that the refrigerant 110 is recharged.

In one or more embodiments, power distribution system 142 is coupled to IT module(s) 102 and supplemental heater 130. Power level transducer or meter 144 measures an electrical load supplied by the power distribution system 142 to IT module(s) 102 and supplemental heater 130. Processor subsystem 136 determines whether the cooling load parameter of DX cooling system 104 has reached a defined recharging threshold based upon the electrical load supplied by the power distribution system 142 reaching a maximum electrical load of IT module(s) 102. If the electrical load supplied has not reached the maximum electrical load, processor subsystem 136 triggers supplemental heater 130 to increase heat delivered to the DX cooling system 104. In particular, processor subsystem 136 determines a difference between the maximum electrical load and the electrical load supplied by the power distribution system 142 and increases electrical load delivered to the supplemental heater to reduce the difference.

In one or more embodiments, controller 134 can be implemented as part of the IT module(s) 102. Controller 134 can have dedicated control and sensor interlinks to the control valve 112 and performance and pressure transducers 114, 117 and any other components that have to be controlled or interfaced with to configure AHU 132 for recharging. In one or more embodiments, controller 134 can activate DX cooling system 104 and place any actuators to a correct position for directing air flow through supplemental heater 130 and IT module(s) 102. In one or more embodiments, controller 134 can coordinate activities with a host controller 146 of the IT module(s) 102 or with a cooling system controller 148 to obtain necessary inputs and to trigger actuations and notifications. Cooling system controller 148 can provide overall control of a cooling system 150 that includes DX cooling system 104 and AHU 132. Cooling system controller 148 activates an air mover 152 to move cooling air 154 through AHU 132 and IT modules 102. Cooling system controller 148 selects a mode of AHU 132 such as closed mode with all cooling air 154 being recirculated based at least in part on sensing temperature values of the cooling air. A cold aisle temperature transducer 156 senses a temperature value of IT supply air upstream of IT modules 102 and a hot aisle temperature transducer 158 senses a temperature value of IT return air downstream of IT modules 102. Determining when the cooling load parameter of the DX cooling system 104 has reached the defined recharging threshold can be based upon one or more temperature values of the cooling air 154.

Figure 2:
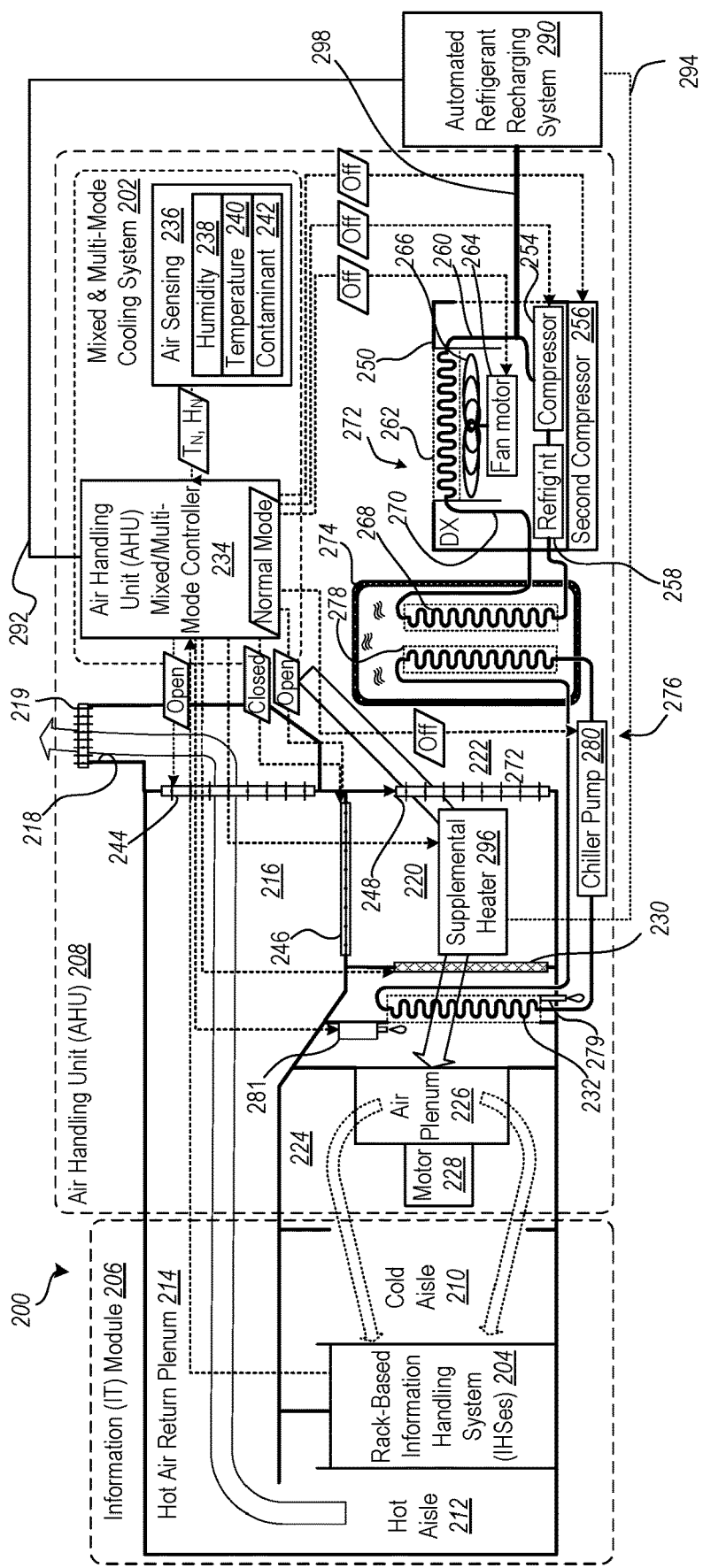
FIG. 2 is a block diagram representation of an example data center having a direct expansion (DX) cooling system that performs mixed cooling modes, according to one or more embodiments.
Figure 3:
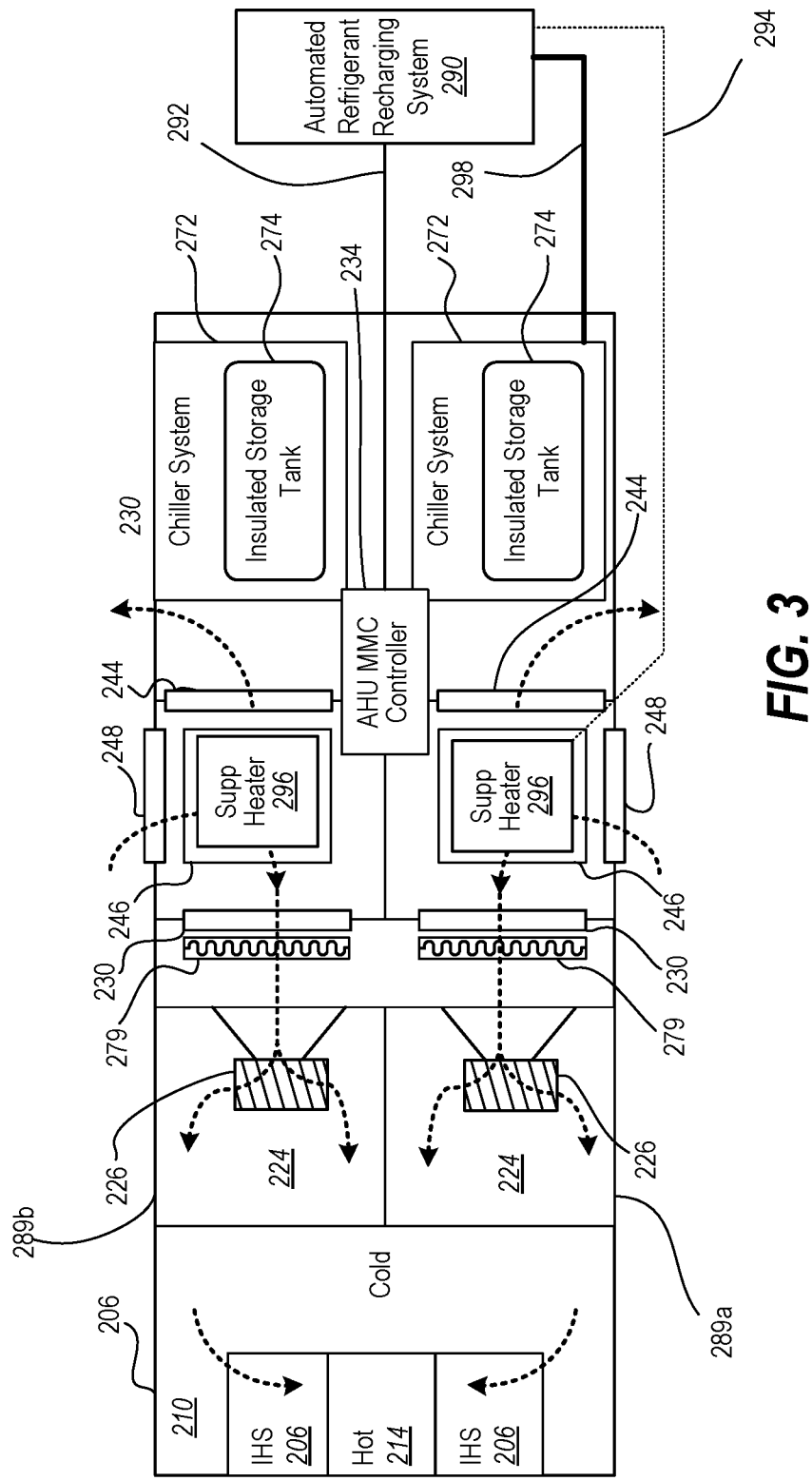
FIG. 3 is a block diagram representation of the example data center having the DX cooling system with paired air handling units, according to one or more embodiments.

FIGS. 2-3 are block diagram representations of an example data center 200 having a DX cooling system 202 that can reduce energy costs by expanding use of outside air for cooling using mixed and multiple modes. The term mixed mode refers to using recirculated air to warm outside air that is otherwise too cold (or too humid). Multi-mode refers to performing mechanical cooling while using outside cooling air, via a process referred to herein as mechanical trimming. The expanded use of outside air includes partial use of outside air even when the outside temperature and the outside humidity are not within an acceptable range for IHSs 204 within IT module 206 of data center 200. In one embodiment, DX cooling system 202 directly controls air handling unit (AHU) 208 that provides cooling to at least one IT module within modular data center 200. In at least one embodiment, data center 200 is and/or is configured as an Expandable Modular Information Technology (IT) Building Infrastructure (EMITBI). Further, because of the relatively large scale of data center 200 and the use of modular building blocks that house the IT gear within the data center 200, the combination of IT modules 206 that are cooled by AHUs 208 are collectively referred to herein as a modularly-constructed, large-scale information handling system (LIHS) or simply an IHS 204.

Data center 200 of FIG. 2 includes IT module 206 having a row of rack-mounted IHSs 204 that separate cold aisle 210 from hot aisle 212, which is in fluid communication with hot air return plenum 214. AHU 208 includes return chamber 216 that is in fluid communication with hot air return plenum 214. AHU 208 includes an exhaust portal, such as, but not limited to, exhaust chimney 218, which is in in fluid communication with return chamber 216. AHU 208 includes intake chamber 220 that is in fluid communication with return chamber 216 and outside environment 222. In one embodiment, exhaust chimney 218 mitigates warmed air being drawn into intake chamber 220. However, an exhaust portal 219 can be flush mounted by omitting an exhaust chimney 218, relying on spacing to prevent inadvertent recirculation. It is appreciated that the outside environment encompasses some or all of the exterior of AHU 208 and data center 200, and the specific location illustrated within FIG. 2 only references one location adjacent/relative to intake chamber 220 for simplicity in describing the intake process of external air. AHU 208 includes an air mover to move air through IT module 206. Specifically, AHU 208 includes outlet chamber 224 that is uniformly pressurized by air plenum blower 226 driven by motor 228. Air plenum blower 226 pulls air in axially and sprays it out radially within an enclosed space to pressurize evenly. Air plenum blower 226 draws air from intake chamber 220 through contaminant filter 230 and chiller coil 232. The pressurized air in outlet chamber 224 exits AHU 208 and enters cold aisle 210 of IT module 206.

AHU 208 can be configured for a mode of cooling that is appropriate for the outside ambient conditions. In one or more embodiments, AHU 208 can be configured by DX cooling system 202 for one of (1) a normal mode, (2) a mixed mode, (3) a mechanical trim mode, and (4) a closed mode. FIG. 2 illustrates AHU 208 having AHU MMC controller 234 that is responsive to air sensing components 236. Air sensing components 236 can include, but are not limited to, humidity sensor 238, temperature sensor 240, and gas/liquid/solid contaminant sensor 242. When air sensing components 236 indicate that the ambient temperature of the exterior air is within an acceptable (or normal) range (TN) and that the humidity of the exterior air is also within an acceptable range (HN), AHU MMC controller 234 configures AHU 208 for normal mode cooling, which involves using only the outside air for cooling of the IHSs. Exhaust damper 244 is opened between return chamber 216 and exhaust chimney 218 to allow the exhaust air to exit AHU 208. Simultaneously or concurrently, recirculation damper 246 is closed between return chamber 216 and intake chamber 220 to prevent recirculation of the exhaust air. Outside air intake damper 248 is opened, allowing outside air from outside environment 222 to enter AHU 208. In normal mode, direct expansion (DX) cooling unit 250 that supports AHU 208 remains off.

FIG. 2 illustrates DX cooling unit 250 having first compressor 254 and second compressor 256 for stepped performance. Compressors 254, 256 compress and move compressed (liquid) refrigerant on a high side from refrigerant tank 258 through discharge line 260 and through condenser coil 262. Condenser fan motor 264 drives condenser fan 266 to move condensing air through condenser coil 262. The condensing air convectively removes heat (generated during the compression) from the refrigerant. An expansion device (not shown) downstream of condenser coil 262 causes expansion cooling by creating a pressure loss between the high and low sides of DX cooling unit 250. Evaporator coil 268 transfers heat from its ambient environment to the refrigerant that is then pulled from suction line 270 back to refrigerant tank 258. In one embodiment, chiller system 272 operates between DX cooling unit 250 and AHU 208a. Chiller system 272 enables more efficient utilization of DX cooling system 250, avoiding short cycling of compressor 254. DX cooling unit 250 chills water in insulated storage tank 274 that is cooled by evaporator coil 268. Chiller system 272 then includes heat exchanger 276 that includes evaporator coil 268 and heat sink coil 278 in insulated storage tank 274. AHU MMC controller 234 activates chiller pump 280 to move coolant such as water through chiller coil 232 and heat sink coil 278. Compressor 254 can operate for a period of time that is efficient with insulated storage tank 274 supplying an amount of cooling as needed by pumping using a determined flow rate.

DX cooling unit 250 can serve as dehumidifier with condensation on chiller coil 232 being guided by a water drain 279 out of AHUs 208a. Thereby, outside humidity that is above the acceptable range, or would become too high during a multi-mode operation, can be removed. In addition, in one embodiment, MMC cooling system 202 can include humidifier 281 that increases the level of humidity in the moderated outside air by adding moisture.

For clarity, FIG. 2 illustrates one side of AHU 208 having one air flow path. FIG. 3 is a top view illustrating AHU 208 is bifurcated between left and right AHU subsystems 289a-289b, enabling redundancy for stepped performance. AHU MMC controller 234 controls both left and right AHU subsystems 289a, 289b. ARR system 290 can be connected for sensing and control signals to DX cooling unit 250 such as via interconnect 292 to AHU MMC 234 and via remote control channel 294 to supplemental heater 296. Automated refrigerant recharging system 290 can be selectively coupled for fluid transfer via a refrigerant conduit 298 to discharge line 260.

Figure 4:
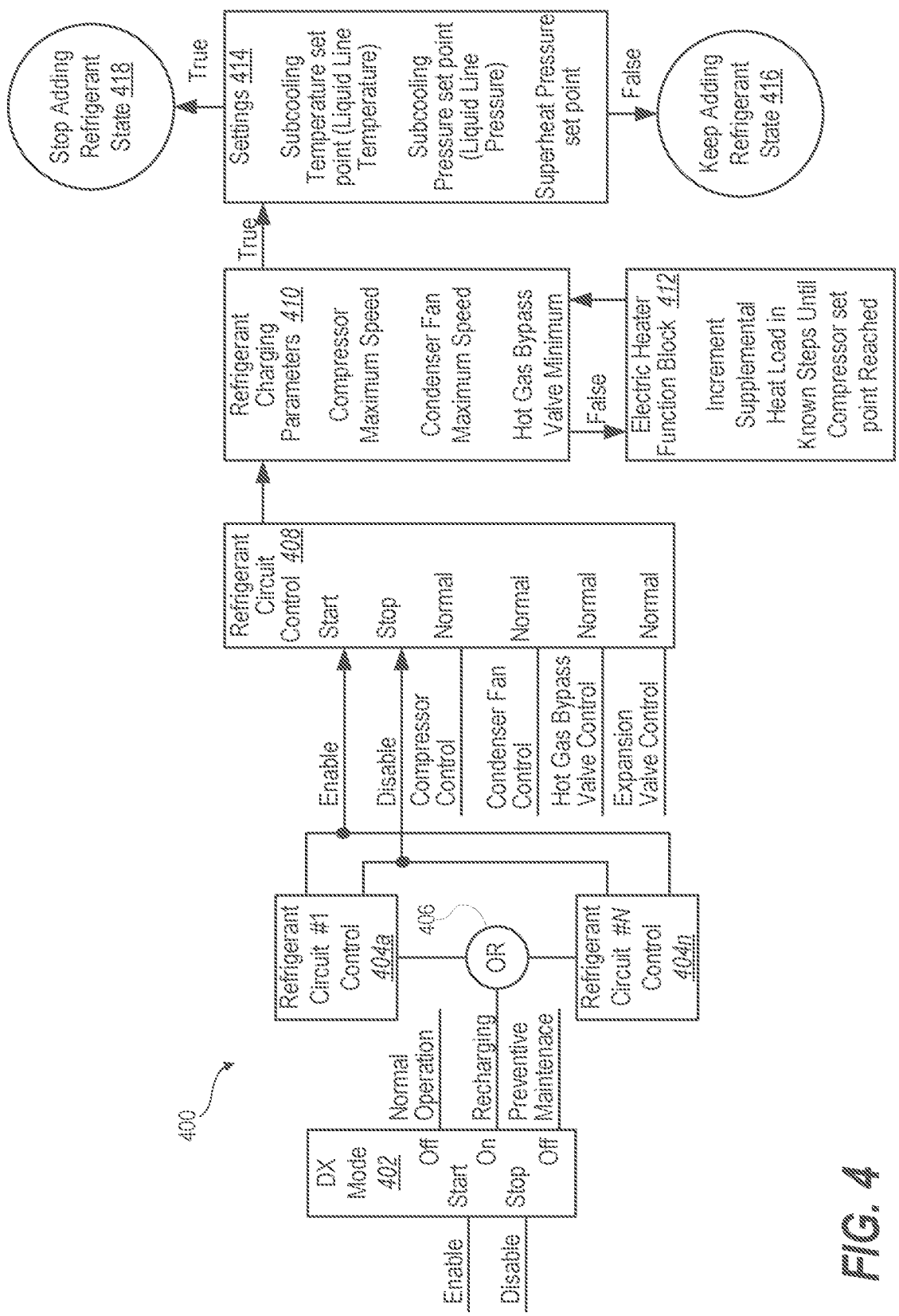
FIG. 4 is a control diagram illustrating a controller coupled to other functional components that collectively enable autonomous recharging of the refrigerant in the DX cooling system, according to one or more embodiments.

FIG. 4 is a control diagram illustrating a controller 400 that implements parameters and settings for supplemental heating to recharge refrigerant in a DX cooling system of an IHS. DX mode block 402 has start set to Enable, stop set to Disable, Normal Operation mode set to Off, Recharging mode set to On, and Preventive Maintenance mode set to Off. Recharging mode affects one or more refrigerant circuit control blocks 1 to N 404a-404n at an OR switch 406. A selected one or more of refrigerant circuit control blocks 1 to N 404a-404n indicate operational to refrigerant circuit control block 408: (i) Enable input is provided to a Start input; and (ii) Disable input is provided to Stop input. Refrigerant circuit control block 408 configures components of DX cooling system 104 (FIG. 1) to Normal mode of operation for recharging. Configured components include: (i) compressor control; (ii) condenser fan control; (iii) hot gas bypass valve control; and (iv) expansion valve control. Processing proceeds to refrigerant charging parameters block 410 to determine if system measurements indicate ready for recharging: (i) compressor maximum speed; (ii) condenser fan maximum speed; and (iii) hot gas bypass valve minimum setting. If False, an electric heater function block 412 is activated to increment supplemental heat load in known steps until compressor set point is reached. Once charging parameters are True in refrigerant charging parameters block 410, processing proceeds to refrigerant charging settings block 414.

Refrigerant charging settings block 414 then checks system settings to see if refrigerant is sufficient recharged: (i) subcooling temperature set point (liquid line temperature); (ii) subcooling pressure set point (liquid line pressure); and (iii) superheat pressure set point. If set points are not satisfied ("False") in refrigerant charging settings block 414, then keep adding refrigerant state 416 is entered or maintained. If set points are satisfied in refrigerant charging settings block 414, then stop adding refrigerant state 418 is entered.

Figure 5:
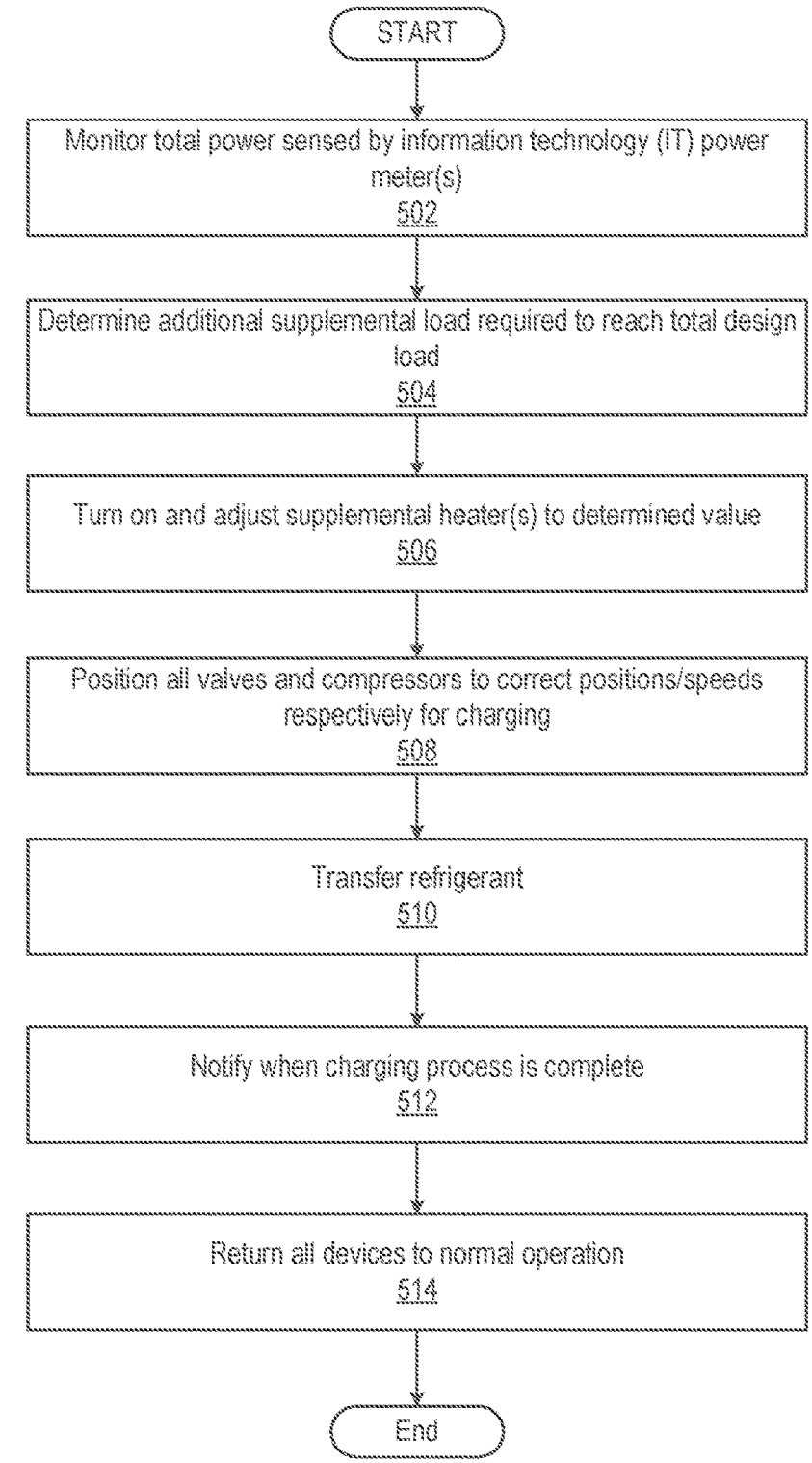
FIG. 5 is a flow diagram illustrating a method of enabling DX refrigerant charging mode, according to one or more embodiments.

FIG. 5 is a flow chart illustrating a method 500 of enabling DX charging mode. Method begins with monitoring, by a controller 134 (FIG. 1), of total power sensed by IT power meter(s) (block 502). Method 500 includes determining the additional supplemental load required to reach total design load (block 504). Controller turns on and adjusts supplemental heater(s) to the determined value representative of the heat generated by the supplemental load (block 506). Method 500 includes positioning all valves and compressors to correct positions/speeds respectively for charging the refrigerant (block 508). Controller 134 (FIG. 1) causes transfer of refrigerant (block 510). Method 500 includes notifying a recipient such as a host system, remote controller or user interface when the charging process is complete (block 512). All devices are also returned to normal operation (block 514). Then method 500 ends.

Figure 6A:
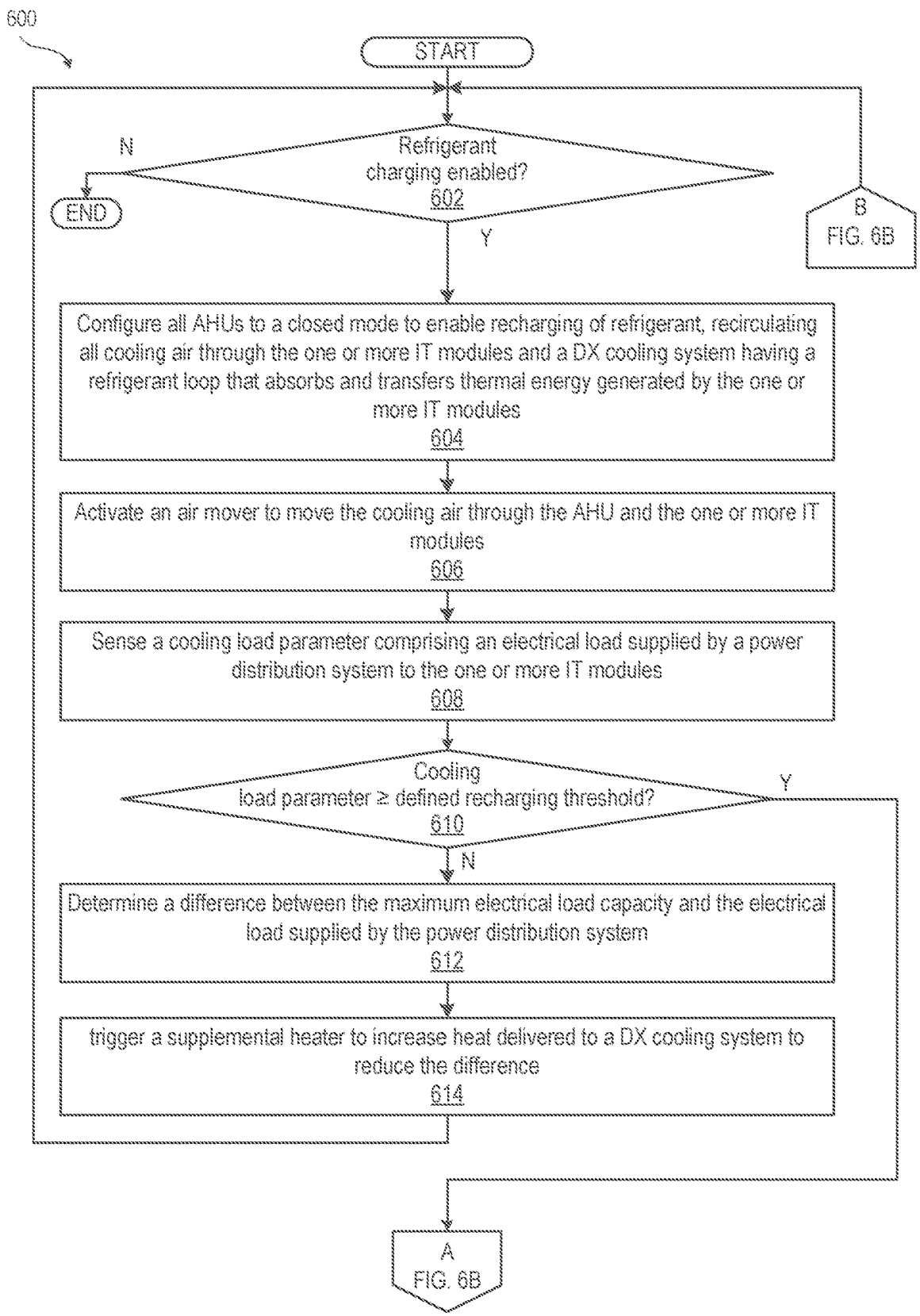
FIGS. 6A-6B are a flow diagram illustrating a method of automatically recharging refrigerant in an IHS, according to one or more embodiments.
Figure 6B:
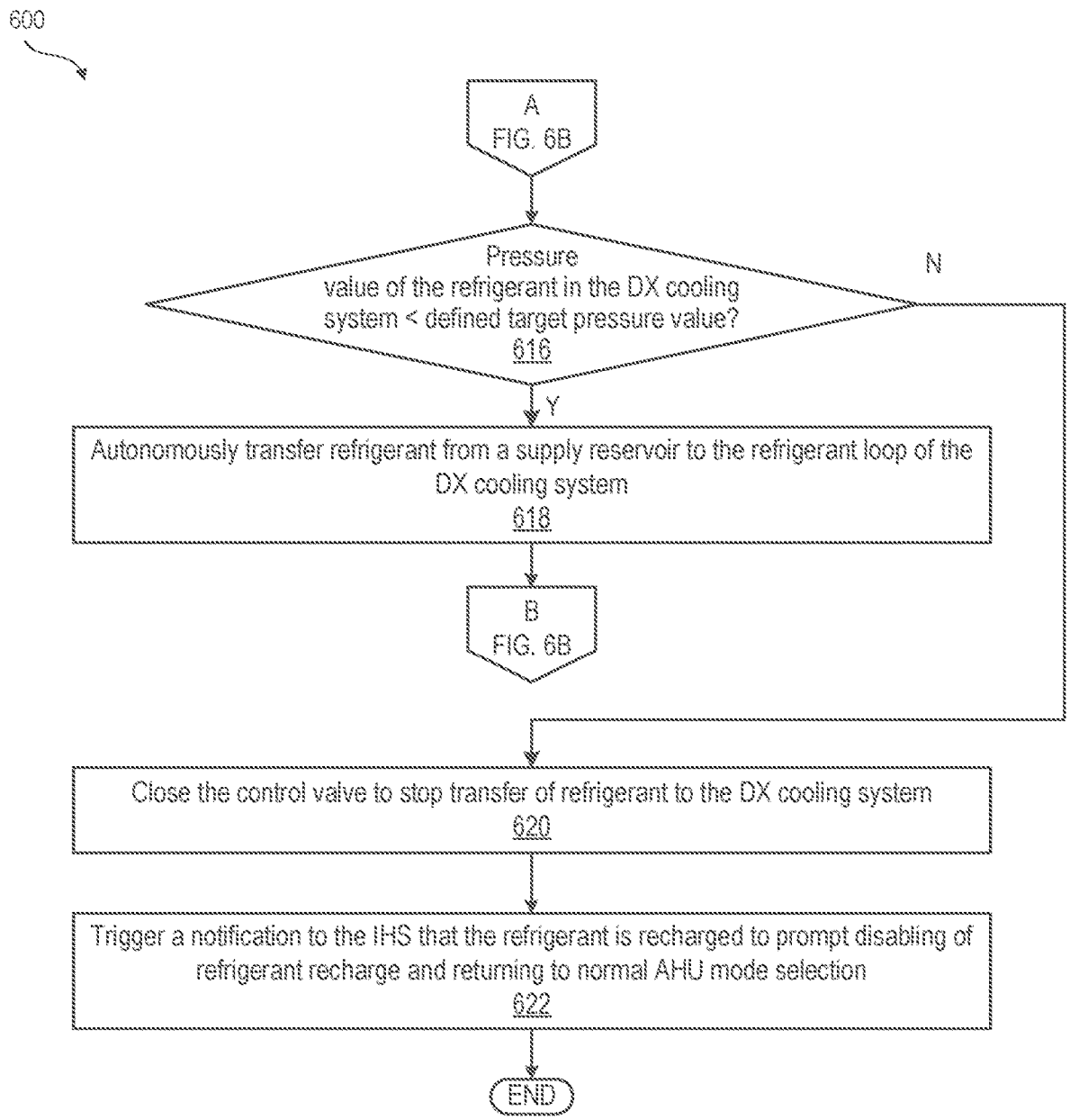

FIGS. 6A-6B are a flow diagram illustrating a method 600 of automatically recharging refrigerant in an IHS 100 (FIG. 1). In one or more embodiments, method 600 begins determining whether refrigerant recharging is enabled (decision block 602). In response to determining that refrigerant recharging is enabled, method 600 includes configuring all AHUs to a closed mode to enable recharging of refrigerant. Closed mode recirculates all cooling air through the one or more IT modules. Closed mode can be used with supplemental heating for a cold temperature scenario. Closed mode can be used with mechanical cooling of the recirculated air. Mechanical cooling can utilize a DX cooling system having a refrigerant loop that absorbs and transfers thermal energy generated by the one or more IT modules (block 604). Method 600 includes activating an air mover to move the cooling air through the AHU and the one or more IT modules (block 606). Method 600 includes sensing a cooling load parameter comprising an electrical load supplied by a power distribution system to the one or more IT modules (block 608). Controller determining whether the cooling load parameter is equal to or greater than a defined recharging threshold (decision block 610). In response to determining that the cooling load parameter is not equal to or greater than the defined recharging threshold, in one or more embodiments controller determines a difference between the maximum electrical load capacity and the electrical load supplied by the power distribution system (block 612). Controller triggers a supplemental heater to increase heat delivered to a DX cooling system to reduce the difference (block 614). Then method returns to decision block 602 to continue recharging refrigerant. In response to determining that refrigerant recharging is not enabled in decision block 602, method 600 ends.

In response to determining that the cooling load parameter is equal to or greater than the defined recharging threshold in decision block 610, method 600 includes determining whether a pressure value of the refrigerant in the DX cooling system is less than the defined target pressure value (decision block 616). In response to the pressure value of the refrigerant being less than the defined target pressure value, method 600 includes autonomously transferring refrigerant from a supply reservoir to the refrigerant loop of the DX cooling system (block 618). Then method returns to decision block 602 to continue recharging refrigerant. In response to the pressure value of the refrigerant being equal to or greater than the defined target pressure value as determined in decision block 616, method 600 includes closing the control valve to stop transfer of refrigerant to the DX cooling system (block 620). Controller triggers a notification to the IHS that the refrigerant is recharged to prompt disabling of refrigerant recharge and returning to normal AHU mode selection (block 622). Then method 600 ends.

In one or more embodiments, method 600 includes: (i) sensing one or more temperature values of the cooling air in the AHU; and (ii) determining whether the cooling load parameter of the DX cooling system has reached the defined recharging threshold based upon one or more temperature values of the cooling air.

In one or more embodiments, method 600 includes: (i) sensing a compressor speed value of a compressor of the refrigerant loop of the DX cooling system; and (ii) determining the cooling load parameter of the DX cooling system based on the compressor speed value.

In the above described flow charts of FIGS. 5, 6A-6B, one or more of the methods may be embodied in an automated controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implemented, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An automated refrigerant recharging system comprising:
   a supply reservoir containing a refrigerant;
   a liquid coupling in fluid communication with the supply reservoir and connectable to a refrigerant loop of a direct expansion (DX) cooling system that absorbs and transfers thermal energy generated by one or more information technology (IT) modules of an information handling system (IHS);
   a control valve that selectively transfers some of the refrigerant from the supply reservoir to the refrigerant loop of the DX cooling system;
      an interface in communication with: (i) a performance transducer that detects a cooling load parameter of the DX cooling system; (ii) a pressure transducer that detects a pressure value of the refrigerant of the DX cooling system; and (iii) a supplemental heater that delivers supplemental thermal energy to the DX cooling system; and
   a controller in communication with the control valve, and the performance and pressure transducers and supplemental heater via the interface and which executes an automated refrigerant recharging utility to enable the automated refrigerant recharging system to:
      trigger the supplemental heater to increase heat delivered to the DX cooling system in response to the cooling load parameter not being equal to or greater than a defined recharging threshold; and
      autonomously open the control valve to transfer refrigerant to the DX cooling system in response to determining that: (i) the cooling load parameter is equal to or greater than the defined recharging threshold; and (ii) the pressure value of the refrigerant of the DX cooling system being less than a defined target pressure value.

2. The automated refrigerant recharging system of claim 1, wherein the controller enables the automated refrigerant recharging system to, in response to determining that the pressure value of the refrigerant of the DX cooling system is equal to or greater than the defined target pressure value:
   close the control valve to stop transfer of refrigerant to the DX cooling system; and
   trigger a notification to the IHS that the refrigerant is recharged.

3. The automated refrigerant recharging system of claim 1, wherein:
   the interface is in communication with an air handling unit (AHU) that is configurable in a selected one of: (i) a closed mode recirculating all cooling air through the one or more IT modules and the DX cooling system; and (ii) an at least partially open mode that directs outside air through the one or more IT modules; and
   the controller enables the automated refrigerant recharging system via the interface to configure the AHU in the closed mode for enabling charging the DX cooling system with the refrigerant.

4. The automated refrigerant recharging system of claim 3, wherein:
   the interface communicates with one or more temperature transducers that sense respective temperature values of cooling air in the AHU; and
   the controller determines whether the cooling load parameter of the DX cooling system has reached the defined recharging threshold based upon the respective temperature values of the cooling air.

5. The automated refrigerant recharging system of claim 1, wherein:
   the interface communicates with a rotational speed transducer that detects a compressor speed value of a compressor of the DX cooling system; and
   the controller enables the automated refrigerant recharging system via the interface to determine the cooling load parameter of the DX cooling system based on the compressor speed value of the DX cooling system.

6. The automated refrigerant recharging system of claim 1, wherein:
   the interface communicates with a power level transducer that measures an electrical load supplied by a power distribution system to the one or more IT modules and the supplemental heater; and
   the controller:
      determines whether the cooling load parameter of the DX cooling system has reached the defined recharging threshold based on the electrical load supplied by the power distribution system reaching a maximum electrical load capacity of the IT modules; and
      triggers the supplemental heater to increase heat delivered to the DX cooling system by: (i) determining a difference between the maximum electrical load capacity and the electrical load supplied by the power distribution system; and (ii) increasing the heat delivered by the supplemental heater to reduce the difference.

7. An information handling system (IHS) comprising:
   one or more information technology (IT) modules;
   a direct expansion (DX) cooling system comprising:
      a refrigerant loop having a refrigerant that absorbs and transfers thermal energy generated by of the one or more IT modules;
      a performance transducer that detects a cooling load parameter of the DX cooling system; and
      a pressure transducer that detects a pressure value of the refrigerant of the DX cooling system;
   an automated refrigerant recharging system comprising:
      a supply reservoir containing the refrigerant;
      a control valve that selectively transfers some of the refrigerant from the supply reservoir to the refrigerant loop of the DX cooling system;
      a controller in communication with the control valve, and the performance and pressure transducers and that executes an automated refrigerant recharging utility to enable the automated refrigerant recharging system to:
         autonomously open the control valve to transfer refrigerant to the DX cooling system in response to determining that: (i) the cooling load parameter is equal to or greater than a defined recharging threshold; and (ii) the pressure value of the refrigerant of the DX cooling system is less than a defined target pressure value; and
         autonomously close the control valve to stop transfer of refrigerant to the DX cooling system in response to determining that the pressure value of the refrigerant of the DX cooling system is equal to or greater than the defined target pressure value; and a supplemental heater in communication with the controller and that delivers thermal energy to the DX cooling system; and wherein the controller, in response to the cooling load parameter being less than the defined recharging threshold, triggers the supplemental heater to increase heat delivered to the DX cooling system.

8. The IHS of claim 7, further comprising:
an air handling unit (AHU) that is configurable in a selected one of: (i) a closed mode recirculating all cooling air through the one or more IT modules and the DX cooling system; and (ii) an at least partially open mode that directs outside air through the one or more IT modules; and the controller configures the AHU in the closed mode for enabling charging the DX cooling system with the refrigerant.

9. The IHS of claim 8, further comprising one or more temperature transducers that sense respective temperature values of cooling air in the AHU, wherein the controller determines whether the cooling load parameter of the DX cooling system has reached the defined recharging threshold based upon the respective temperature values of the cooling air.

10. The IHS of claim 7, further comprising rotational speed transducer that detects a compressor speed value of a compressor of the DX cooling system, wherein the controller enables the automated refrigerant recharging system to determine the cooling load parameter of the DX cooling system based on the compressor speed value, wherein determining the cooling load parameter of the DX cooling system comprises receiving the compressor speed value of the DX cooling system.

11. The IHS of claim 7, further comprising:
a power distribution system coupled to one or more IT modules and the supplemental heater; and
a power level transducer that measures an electrical load supplied by the power distribution system to the one or more IT modules and the supplemental heater, wherein:
the controller:
determines whether the cooling load parameter of the DX cooling system has reached the defined recharging threshold based upon the electrical load supplied by the power distribution system reaching a maximum electrical load capacity of the IT modules; and
triggers the supplemental heater to increase heat delivered to the DX cooling system by: (i) determining a difference between the maximum electrical load capacity and the electrical load supplied by the power distribution system; and (ii) increasing the heat delivered by the supplemental heater to reduce the difference.

12. A method comprising:
determining whether a cooling load parameter of one or more information technology (IT) modules of an information handling system (IHS) is equal to or greater than a defined recharging threshold;

in response to determining that the cooling load parameter is not equal to or greater than the defined recharging threshold, triggering a supplemental heater to increase heat delivered to a direct expansion (DX) cooling system having a refrigerant loop with refrigerant that absorbs and transfers thermal energy generated by the one or more IT modules; and in response to determining that the cooling load parameter is equal to or greater than the defined recharging threshold:
autonomously transferring refrigerant from a supply reservoir to the refrigerant loop of the DX cooling system in response to a pressure value of the refrigerant being less than a defined target pressure value; and
closing a control valve to stop transfer of refrigerant to the DX cooling system in response to the pressure value of the refrigerant being equal to or greater than the defined target pressure value.

13. The method of claim 12, further comprising triggering a notification to the IHS that the refrigerant is recharged in response to determining that the pressure value of the refrigerant is equal to greater than the defined target pressure value.

14. The method of claim 12, further comprising:
configuring an air handling unit (AHU) to a closed mode recirculating all cooling air through the one or more IT modules and the DX cooling system;
activating an air mover to move the cooling air through the AHU and the one or more IT modules;
sensing one or more temperature values of the cooling air in the AHU; and
determining whether the cooling load parameter of the DX cooling system has reached the defined recharging threshold based upon one or more temperature values of the cooling air.

15. The method of claim 12, further comprising:
sensing a compressor speed value of a compressor of the refrigerant loop of the DX cooling system; and
determining the cooling load parameter of the DX cooling system based on the compressor speed value.

16. The method of claim 12, further comprising:
determining whether the cooling load parameter of the DX cooling system has reached the defined recharging threshold based on the electrical load supplied by a power distribution system reaching a maximum electrical load capacity of the IT modules;
determining a difference between the maximum electrical load capacity and the electrical load supplied by the power distribution system; and
increasing the heat delivered by the supplemental heater to reduce the difference.

\* \* \* \* \*